United States Patent
Ozai et al.

(10) Patent No.: US 9,070,846 B2
(45) Date of Patent: Jun. 30, 2015

(54) PRIMER COMPOSITION AND OPTICAL SEMICONDUCTOR APPARATUS USING SAME

(71) Applicant: SHIN-ETSU CHEMICAL CO., LTD., Tokyo (JP)

(72) Inventors: Toshiyuki Ozai, Takasaki (JP); Masanari Moteki, Annaka (JP); Masayuki Ikeno, Maebashi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/154,675

(22) Filed: Jan. 14, 2014

(65) Prior Publication Data

US 2014/0209968 A1 Jul. 31, 2014

(30) Foreign Application Priority Data

Jan. 25, 2013 (JP) .................................... 2013-11686

(51) Int. Cl.
*C09J 143/04* (2006.01)
*H01L 23/29* (2006.01)
*H01L 33/56* (2010.01)

(52) U.S. Cl.
CPC .............. *H01L 33/56* (2013.01); *C09J 143/04* (2013.01); *H01L 2224/48091* (2013.01); *H01L 2224/8592* (2013.01); *C08L 2312/08* (2013.01)

(58) Field of Classification Search
None
See application file for complete search history.

(56) References Cited

U.S. PATENT DOCUMENTS 5,378,535 A * 1/1995 Moncur et al. ................ 428/335

FOREIGN PATENT DOCUMENTS

| JP | A-2000-198930 | 7/2000 |
| JP | A-2004-292714 | 10/2004 |
| JP | A-2004-339450 | 12/2004 |
| JP | A-2005-093724 | 4/2005 |
| JP | A-2007-246803 | 9/2007 |
| JP | A-2008-179694 | 8/2008 |
| JP | A-2010-168496 | 8/2010 |
| JP | A-2012-144652 | 8/2012 |

OTHER PUBLICATIONS

"Poly(dimethylsiloxane) Macromonomers Having Both Alkenyl and Polymerizable Groups. Application to Crosslinkable Copolymers" authored by Suzuki et al. And published in Polymer (1988) 29, 2095-2099.*
machine-generated translation of JP 2010-168496.*

* cited by examiner

Primary Examiner — Marc Zimmer
(74) Attorney, Agent, or Firm — Oliff PLC

(57) ABSTRACT

The invention provides a primer composition which adheres a substrate mounting an optical semiconductor device and a cured material of an addition reaction curing silicone composition that encapsulates the optical semiconductor device includes (A) an acrylic resin containing either one or both of an acrylate ester and a methacrylate ester that contains one or more $SiCH{=}CH_2$ groups in the molecule, and (B) solvent. There can be provided a primer composition in which the adhesion between a substrate mounting an optical semiconductor device and a cured material of an addition reaction curing silicone composition that encapsulates the optical semiconductor device can be improved, the corrosion of a metal electrode formed on the substrate can be prevented, and the heat resistance of a primer itself can be improved.

24 Claims, 1 Drawing Sheet

PRIMER COMPOSITION AND OPTICAL SEMICONDUCTOR APPARATUS USING SAME

BACKGROUND OF THE INVENTION

1. Field of the Invention

The present invention relates to a primer composition in which a substrate mounting an optical semiconductor device is caused to adhere to a cured material of an addition reaction curing silicone composition that encapsulates the optical semiconductor device, and an optical semiconductor apparatus using the same.

2. Description of the Related Art

Light-emitting diode (LED) lamp known as an optical semiconductor apparatus has LED as an optical semiconductor device, and is configured by encapsulating the LED mounted on a substrate with an encapsulant including a transparent resin. As the encapsulant encapsulating the LED, an epoxy resin-based composition has been generally used so far. However, when an epoxy resin-based encapsulant is used, cracking and yellowing are likely to be caused by an increase in heat value and a decrease in the wavelength of light that are accompanied by miniaturization of a semiconductor package and increased brightness of LED in recent years. The reliability may decrease.

In terms of excellent heat resistance, a silicone composition has been used as an encapsulant (e.g., Patent Document 1). In particular, an addition reaction curing silicone composition is suitable for an encapsulant for LED since it is cured by heating in a short time and has good productivity (e.g., Patent Document 2). However, the adhesion between a substrate mounting LED and an encapsulant including a cured material of the addition reaction curing silicone composition is not sufficient.

On the other hand, a polyphthalamide resin has been often used as a substrate mounting LED since the mechanical strength is excellent. Therefore, a primer useful for the resin has been developed (e.g., Patent Document 3). However, in LED that requires a high light amount, the heat resistance of polyphthalamide resin is not sufficient, and the resin is tarnished. Recently, ceramic typified by alumina having more excellent heat resistance than the polyphthalamide resin has been often used for a substrate. A substrate made of alumina ceramic is easily delaminated from the cured material of the addition reaction curing silicone composition.

Since a silicone composition generally has excellent gas permeability, it is likely to be affected by the outside environment. When LED lamp is exposed to sulfur compounds, exhaust gas, or the like in the air, the sulfur compounds or the like permeate a cured material of the silicone composition, and a metal electrode, especially an Ag electrode on a substrate encapsulated by the cured material is corroded with time and turns black. As a countermeasure for this phenomenon, a primer using a polymer of acrylate ester containing a SiH group, a copolymer with an acrylate ester, a copolymer with a methacrylate ester, a copolymer with an acrylate ester and a methacrylate ester (Patent Document 4), and a primer using a silazane compound or a polysilazane compound that has at least one silazane bond in the molecule (Patent Document 5) have been developed. However, a primer having all heat resistance, adhesion, and corrosion such as sulfuration resistance has not been developed.

As conventional techniques associated with the present invention, the above-described documents and the following documents (Patent Documents 6 to 8) can be exemplified.

PRIOR ART DOCUMENTS

Patent Documents

Patent Document 1: Japanese Patent Laid-Open Publication No. 2000-198930
Patent Document 2: Japanese Patent Laid-Open Publication No. 2004-292714
Patent Document 3: Japanese Patent Laid-Open Publication No. 2008-179694
Patent Document 4: Japanese Patent Laid-Open Publication No. 2010-168496
Patent Document 5: Japanese Patent Laid-Open Publication No. 2012-144652
Patent Document 6: Japanese Patent Laid-Open Publication No. 2004-339450
Patent Document 7: Japanese Patent Laid-Open Publication No. 2005-93724
Patent Document 8: Japanese Patent Laid-Open Publication No. 2007-246803

SUMMARY OF THE INVENTION

The present invention was made in view of the above situation, and has an object to provide a primer composition in which the adhesion between a substrate mounting an optical semiconductor device and a cured material of an addition reaction curing silicone composition that encapsulates the optical semiconductor device can be improved, the corrosion of a metal electrode formed on the substrate can be prevented, and the heat resistance of a primer itself can be improved.

In order to achieve the object, the present invention provides a primer composition through which a substrate mounting an optical semiconductor device is caused to adhere to a cured material of an addition reaction curing silicone composition that encapsulates the optical semiconductor device, including (A) an acrylic resin containing either one or both of acrylate ester and methacrylate ester that contains one or more SiCH=$CH_2$ groups in the molecule, and (B) solvent.

According to such a primer composition, the adhesion between the substrate mounting the optical semiconductor device and the cured material of the addition reaction curing silicone composition that encapsulates the optical semiconductor device can be improved, the corrosion of a metal electrode formed on the substrate can be prevented, and the heat resistance of a primer itself can be improved.

At this time, it is preferable that the amount of the component (B) to be added be 90% by weight or more relative to the whole amount.

When the primer composition contains the component (B) in an amount of 90% by weight or more, the workability of the primer composition can be improved.

It is preferable that the primer composition further contain (C) silane coupling agent.

When the primer composition contains the silane coupling agent, the adhesion of the primer composition can be further improved.

Moreover, the present invention provides an optical semiconductor apparatus in which a substrate mounting an optical semiconductor device is caused to adhere to a cured material of an addition reaction curing silicone composition that encapsulates the optical semiconductor device through the primer composition.

According to such an optical semiconductor apparatus, the substrate is caused to firmly adhere to the cured material of the addition reaction curing silicone composition, and the corrosion of a metal electrode formed on the substrate can be prevented. Therefore, the optical semiconductor apparatus has a high reliability.

At this time, it is preferable that the optical semiconductor device be for light-emitting diode.

Thus, the optical semiconductor apparatus of the present invention can be suitably used for light-emitting diode.

It is preferable that a material constituting the substrate be any one of polyphthalamide resin, fiber-reinforced plastics, and ceramic.

The adhesion of the primer is excellent, and therefore the optical semiconductor apparatus of the present invention can be used without detracting from the adhesion even in the substrate.

Further, it is preferable that the cured material of the addition reaction curing silicone composition be in a rubber state.

According to such a cured material of an addition reaction curing silicone composition, the firm adhesion can be achieved, and the corrosion of a metal electrode, especially an Ag electrode formed on the substrate can be effectively prevented.

Further, it is preferable that the cured material of the addition reaction curing silicone composition be a transparent cured material.

Such a cured material of an addition reaction curing silicone composition can be suitably used as an encapsulant for an optical semiconductor device such as light-emitting diode.

According to the primer composition of the present invention, the adhesion between a substrate mounting an optical semiconductor device and a cured material of an addition reaction curing silicone composition that encapsulates the optical semiconductor device can be improved, the corrosion of a metal electrode formed on the substrate can be prevented, and the heat resistance of a primer itself can be improved. Further, when the primer composition is used for an optical semiconductor apparatus, an optical semiconductor apparatus having a high reliability can be obtained.

DETAILED DESCRIPTION OF THE PREFERRED EMBODIMENTS

Figure 1:
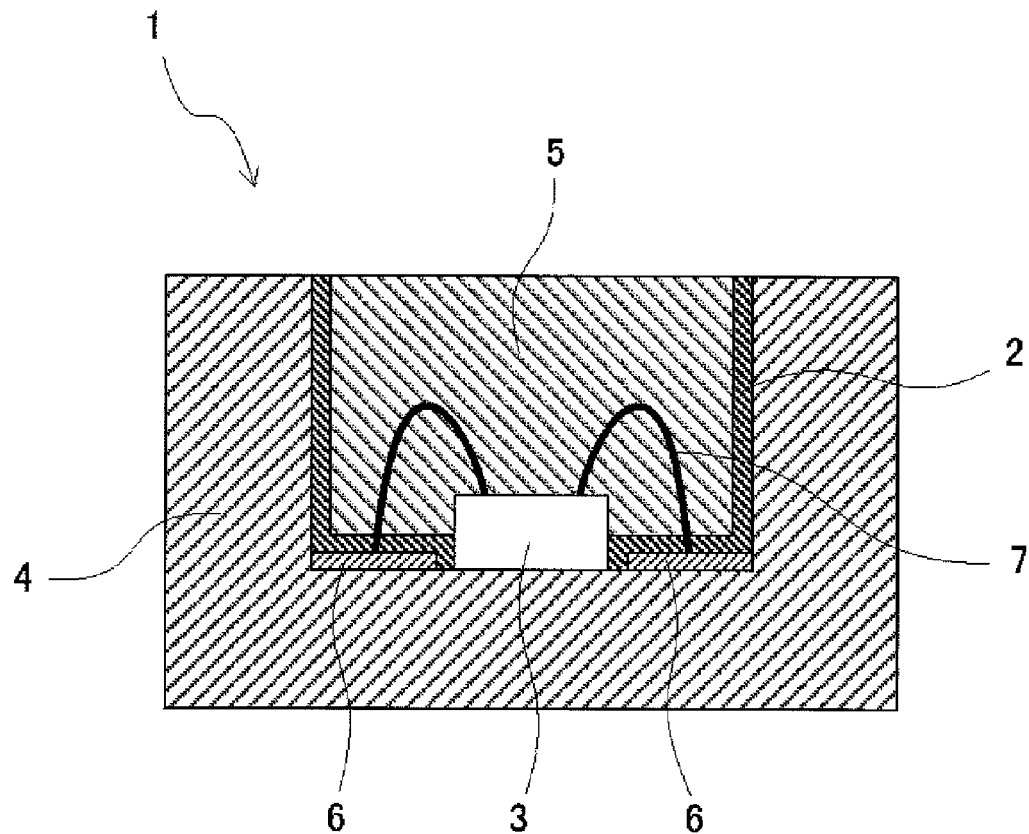
FIG. 1: a cross-sectional view of LED lamp showing one example of an optical semiconductor apparatus according to the present invention.

The present inventors carried out an extensive investigation to achieve the object, and as a result, found that when an acrylic resin containing acrylate ester or methacrylate ester that contains one or more SiCH=CH$_2$ groups in the molecule is added to a composition, a primer composition which causes a substrate (especially, an alumina ceramic substrate) mounting an optical semiconductor device to firmly adhere to a cured material of an addition reaction curing silicone composition that encapsulates the optical semiconductor device, and in which the corrosion of a metal electrode, especially an Ag electrode formed on the substrate can be prevented, and an optical semiconductor apparatus having a high reliability using the same can be obtained. The present invention was accomplished.

Therefore, the primer composition of the present invention is a primer composition which adheres a substrate mounting an optical semiconductor device and a cured material of an addition reaction curing silicone composition that encapsulates the optical semiconductor device, including (A) an acrylic resin containing either one or both of acrylate ester and methacrylate ester that contains one or more SiCH=CH$_2$ groups in the molecule, and (B) solvent.

Hereinafter, the respective components of the primer composition of the present invention will be described.

<Primer Composition>
[Component (A)]

The component (A) in the primer composition of the present invention is an acrylic resin containing either one or both of acrylate ester(s) and methacrylate ester(s) that contains one or more SiCH=CH$_2$ groups in the molecule. For example, the component (A) imparts sufficient adhesion to a substrate mounting LED, especially a ceramic substrate, or a polyphthalamide resin substrate, and the corrosion of a metal electrode (especially an Ag electrode) with time formed on the substrate is suppressed.

Examples of such an acrylic resin include a homopolymer of acrylate ester having one or more SiCH=CH$_2$ groups in the molecule, a homopolymer of methacrylate ester having one or more SiCH=CH$_2$ groups in the molecule, a copolymer of acrylate ester having one or more SiCH=CH$_2$ groups in the molecule and methacrylate ester having one or more SiCH=CH$_2$ groups in the molecule, a copolymer of acrylate ester having one or more SiCH=CH$_2$ groups in the molecule and other kind of acrylate ester, and a copolymer of methacrylate ester having one or more SiCH=CH$_2$ groups in the molecule and other kind of methacrylate ester.

Examples of the acrylate ester or methacrylate ester that contains one or more SiCH=CH$_2$ groups in the molecule include compounds having the following structure,

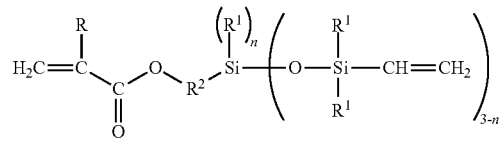

wherein R represents hydrogen or a methyl group, $R^1$ represents a monovalent organic group, $R^2$ represents a divalent organic group, and "n" represents an integer of 0 to 2.

Further, diorganopolysiloxane compounds having the following units are exemplified,

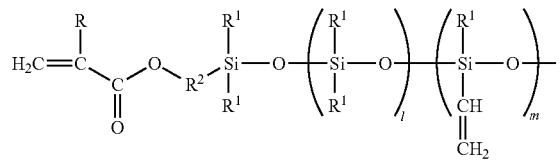

wherein "l" is a positive number including 0, and "m" is a positive number other than 0.

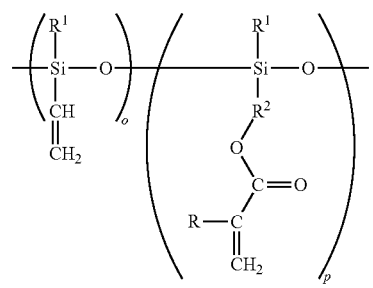

wherein "o" and "p" are positive numbers other than 0.

Examples of the other kind of acrylate ester include methyl acrylate, ethyl acrylate, n-butyl acrylate, isobutyl acrylate, isopentyl acrylate, n-hexyl acrylate, isooctyl acrylate, 2-ethylhexyl acrylate, n-octyl acrylate, isononyl acrylate, n-decyl acrylate, and isodecyl acrylate. Examples of the other kind of methacrylate ester include methyl methacrylate, ethyl methacrylate, n-butyl methacrylate, isobutyl methacrylate, isopentyl methacrylate, n-hexyl methacrylate, isooctyl methacrylate, 2-ethylhexyl methacrylate, n-octyl methacrylate, isononyl methacrylate, n-decyl methacrylate, and isodecyl methacrylate. Among these, alkyl acrylate and alkyl methacrylate that have an alkyl group having 1 to 12 carbon atoms, and particularly an alkyl group having 1 to 4 carbon atoms are preferable. The monomers may be used singly or in combination of two or more kinds.

As a method for synthesizing an acrylic resin as the component (A), a method in which the corresponding monomer is treated with a radical polymerization initiator such as 2,2'-azobisisobutyronitrile (AIBN) is exemplified.

The content of the component (A) is not particularly restricted as long as it is such an amount that the component (A) is dissolved in the component (B) described below. It is preferably 10% by weight or less, more preferably 0.01 to 7% by weight, further preferably 0.1 to 5% by weight, and particularly preferably 0.2 to 3% by weight, relative to the whole composition (total amount of the components (A) and (B)). When the component (A) is not contained, the heat resistance is not obtained. When the content is 10% by weight or less, a film is not cracked by generation of irregularities on the surface, and a performance sufficient for a primer can be obtained.

[Component (B)]

Solvent as the component (B) is not particularly restricted as long as it is solvent in which the component (A) and components described below are dissolved, and known organic solvent can be used. Examples of the solvent include xylene, toluene, benzene, heptane, hexane, trichloroethylene, perchloroethylene, methylene chloride, ethyl acetate, methyl isobutyl ketone, methyl ethyl ketone, ethanol, isopropanol, butanol, ligroin, cyclohexanone, diethyl ether, rubber solvent, and silicone-based solvent. These solvents may be used singly or as mixed solvent in combination of two or more kinds according to the evaporation rate during applying the primer.

The amount of the component (B) to be added is not particularly restricted as long as it falls within a range which does not cause difficulty to the workability during applying and drying, and it is preferably 90% by weight or more, and more preferably 93 to 99% by weight relative to the whole composition (total amount of the components (A) and (B)). When the amount of the component (B) to be added is 90% by weight or more, the workability of the primer composition can be improved. For example, the substrate described below can be made uniform during formation of a primer, a film is not cracked by generation of irregularities on the surface, and a performance sufficient for the primer can be obtained.

[Component (C)]

The primer composition of the present invention may further contain silane coupling agent as a component (C). As the silane coupling agent, general silane coupling agent may be used, and examples thereof include vinyltrimethoxysilane, vinyltriethoxysilane, glycidoxypropyltrimethoxysilane, methacryloxypropyl trimethoxysilane, acryloxypropyltrimethoxysilane, and mercaptopropyltrimethoxysilane.

The amount of the component (C) to be added is preferably 0.05 to 5% by weight, and more preferably 0.1 to 2% by weight relative to the whole composition (total amount of the components (A) to (C)). When the amount of the component (C) to be added is 0.05% by weight or more, an effect of improving the adhesion is sufficient. When the component (C) is added in an amount more than 10% by weight, the effect of further improving the adhesion is not obtained. Therefore, it is preferable that the amount of the component (C) to be added be 10% by weight or less.

[Other Component]

In addition to the components (A) and (B) that are basic components, the primer composition of the present invention may contain other optional component, if necessary. For example, as metal corrosion inhibitor, benzotriazole, butyl hydroxy toluene, hydroquinone, or derivative thereof may be contained. Benzotriazole, dibutyl hydroxy toluene, hydroquinone, or derivative thereof is component in which the corrosion of a metal electrode, especially an Ag electrode on a substrate encapsulated with an encapsulant (cured material of addition reaction curing silicone) for LED lamp is more effectively suppressed when LED lamp is exposed to a severe outside environment, and for example, sulfur compounds in the air permeates the encapsulant.

In order to further improve the adhesion between the SiCH=CH$_2$ group in the component (A) and the addition reaction curing silicone composition, platinum catalyst as catalyst for addition reaction may be added. Further, as the other optional component, reinforcing filler, dye, pigment, heat resistance improver, antioxidant, adhesion promoter, or the like may be added.

[Method for Producing Primer Composition]

As the method for producing a primer composition of the present invention, a method of uniformly mixing the components (A) and (B) as the basic components, and the optional component at normal temperature by a mixing stirrer is exemplified.

<Optical Semiconductor Apparatus>

It is preferable that the optical semiconductor apparatus of the present invention be an optical semiconductor apparatus in which a substrate mounting an optical semiconductor device is caused to adhere to a cured material of an addition reaction curing silicone composition that encapsulates the optical semiconductor device through the primer composition.

Hereinafter, an aspect of the optical semiconductor apparatus of the present invention will be described with reference to the drawings.

FIG. 1 is a cross-sectional view showing one example of the optical semiconductor apparatus according to the present invention, and shows LED lamp. An optical semiconductor apparatus (LED lamp) 1 is an optical semiconductor apparatus in which a substrate 4 mounting LED 3 as an optical semiconductor device is caused to adhere to a cured material 5 of an addition reaction curing silicone composition that encapsulates the LED 3 through a primer composition 2 described above. On the substrate 4, a metal electrode 6 such as an Ag electrode is formed, an electrode terminal (not shown) of the LED 3 is electrically connected to the metal electrode 6 through a bonding wire 7.

The cured material 5 of the addition reaction curing silicone composition is obtained by curing an addition reaction curing silicone composition containing vinyl group-containing polyorganosiloxane, polyorganohydrogensiloxane, and platinum-based catalyst, is preferably in a rubber state, and is preferably a transparent cured material. As the other optional component, reaction inhibitor, colorant, flame retardant-imparting agent, heat resistance improver, plasticizer, reinforcing silica, adhesion-imparting agent, or the like may be added to the addition reaction curing silicone composition.

Examples of a material constituting the substrate 4 include polyphthalamide resin, various fiber-reinforced plastics, and ceramic. In particular, in terms of good heat resistance, alumina ceramic is preferable. Previously, there is a problem of adhesion between a substrate formed from the material and a cured material of an addition reaction curing silicone composition as described above. Therefore, separation is caused. However, when the primer composition of the present invention is used for adhesion, firm adhesion can be achieved without separation. Therefore, an optical semiconductor apparatus can be produced using the material having good mechanical strength and heat resistance for a substrate.

As a method for producing the optical semiconductor apparatus 1 shown in FIG. 1, the following method is exemplified.

The metal electrode 6 such as an Ag electrode is formed in advance by Ag plating on the substrate 4, an optical semiconductor device such as the LED 3 is bonded to the substrate 4 through an adhesive, and the electrode terminal (not shown) of the LED 3 is electrically connected to the metal electrode 6 through the bonding wire 7. After then, the substrate 4 mounting the LED 3 is cleaned, if necessary. The primer composition 2 is applied to the substrate 4 by an application apparatus such as a spinner or a sprayer, and solvent in the primer composition 2 is volatilized by heating or air-drying. A coating having a thickness of preferably 10 μm or less, and more preferably 0.01 to 1 μm is formed. After primer treatment, an addition reaction curing silicone composition is applied by a dispenser or the like, followed by standing at room temperature or heating, and is cured to encapsulate the LED 3 with a rubber cured material 5.

As described above, when the primer composition is used, a substrate mounting an optical semiconductor device such as LED is caused to firmly adhere to a cured material of an addition reaction curing silicone composition. Therefore, an optical semiconductor apparatus having a high reliability, especially LED lamp can be provided.

Even when the LED lamp is exposed to a severe outside environment and sulfur compounds, or the like, in the air permeates the cured material of the silicone composition, the use of the primer composition can suppress the corrosion of a metal electrode, especially an Ag electrode on a substrate.

The optical semiconductor apparatus of the present invention can be suitably used for LED. The aspect is described by using an optical semiconductor apparatus for LED as one example of the optical semiconductor device. In addition, the optical semiconductor apparatus can be applied to phototransistor, photodiode, CCD, photovoltaic module, EPROM, photo coupler, or the like.

EXAMPLES

In the following, the present invention will be explained specifically by Synthesis Examples, Examples, and Comparative Examples, but the present invention is not restricted to the following Examples.

Synthesis Example 1

SiCH=$CH_2$ Group-Containing Methacrylate Ester

A 500-mL four necked flask equipped with a graham condenser and a thermometer was charged with 124 g of methacryloxypropyltrimethoxysilane (0.5 mol) and 149 g of 1,3-divinyl 1,1,3,3-tetramethyldisiloxane (0.8 mol), and the mixture was cooled to 10° C. or lower by an ice bath. After the cooling, 13.7 g of concentrated sulfuric acid was added and mixed for 20 minutes. After the mixing, 14.4 g of water (0.75 mol) was added dropwise to perform hydrolysis equilibration reaction. After completion of the reaction, 4.5 g of water was added to separate waste acid. 250 g of 10% mirabilite solution and 220 g of toluene were added followed by washing with water, to remove an acid catalyst component. After the removing, the solvent was removed by condensation at 100° C./5 mmHg, to obtain 183 g of methacryloxypropyltris(dimethylvinylsiloxy)silane having the following structure (yield: 80%).

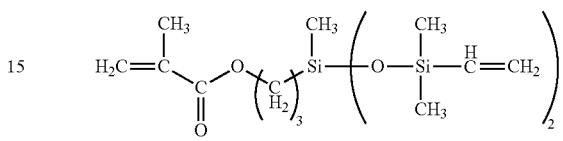

Synthesis Example 2

SiCH=$CH_2$ Group-Containing Methacrylate Ester 355 g of octamethyl cyclotetrasiloxane (1.2 mol), 414 g of 1,3,5,7-tetramethyl-1,3,5,7-tetravinylcyclotetrasiloxane (1.2 mol), 39.7 g of dimethacryloxypropyl tetramethyldisiloxane (0.12 mol), 22.3 g of divinyl tetramethyldisiloxane (0.12 mol), and 2 g of methanesulfonic acid (amount of catalyst) were placed in a 1-L four necked flask equipped with a graham condenser and a thermometer, heated to 60 to 70° C., and mixed for 6 hours. After the mixing, the temperature was cooled to room temperature, and 24 g of baking soda was added to neutralize the mixture. After the neutralization, the mixture was filtered, and the filtrate was concentrated at 100° C./5 mmHg, to remove an unreacted component. Thus, 497 g of α-methacryloxypropylsiloxy-ω-dimethylvinylsiloxy-polydimethylmethylvinylsiloxane having the following structure was obtained (yield: 70%).

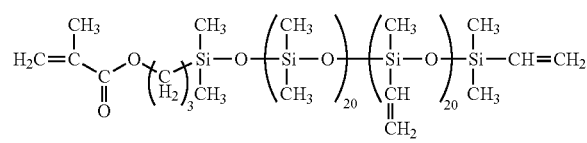

Comparative Synthesis Example 1

SiH-Containing Methacrylate Ester

A 500-mL four necked flask equipped with a graham condenser and a thermometer was charged with 124 g of methacryloxypropylmethyldimethoxysilane (0.5 mol) and 107 g of 1,1,3,3-tetramethyldisiloxane (0.8 mol), and the mixture was cooled to 10° C. or lower by an ice bath. After the cooling, 13.7 g of concentrated sulfuric acid was added and mixed for 20 minutes. After the mixing, 14.4 g of water (0.75 mol) was added dropwise to perform hydrolysis equilibration reaction. After completion of the reaction, 4.5 g of water was added to separate waste acid. 250 g of 10% mirabilite solution and 220 g of toluene were added, followed by washing with water, to remove an acid catalyst component. After the removing, the solvent was removed by condensation at 50° C./5 mmHg, to obtain 152 g of methacryloxypropylmethylbis(dimethylsiloxy)silane having the following structure (yield: 80%).

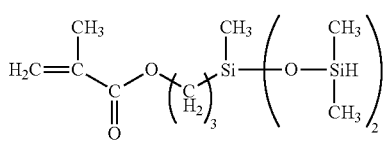

Synthesis Example 3

SiCH=CH₂ Group-Containing Methacrylate Ester Polymer

54 Parts by mass of methyl methacrylate, 11 parts by mass of SiCH=CH₂ group-containing methacrylate ester obtained in Synthesis Example 1, 600 parts by mass of mixed solvent of isopropyl alcohol (IPA) and ethyl acetate, and 0.5 parts by mass of 2,2'-azobisisobutyronitrile (AIBN) were heated and stirred at 80° C. for 3 hours to prepare a solution containing an SiCH=CH₂ group-containing methacrylate ester polymer.

Synthesis Example 4

SiCH=CH₂ Group-Containing Methacrylate Ester Polymer

57 Parts by mass of methyl methacrylate, 24 parts by mass of SiCH=CH₂ group-containing methacrylate ester obtained in Synthesis Example 2, 750 parts by mass of ethyl acetate, and 0.5 parts by mass of 2,2'-azobisisobutyronitrile (AIBN) were heated and stirred at 80° C. for 3 hours to prepare a solution containing an SiCH=CH₂ group-containing methacrylate ester polymer.

Comparative Synthesis Example 2

43 Parts by mass of methyl methacrylate, 22 parts by mass of SiH-containing methacrylate ester obtained in Comparative Synthesis Example 1, 600 parts by mass of mixed solvent of isopropyl alcohol (IPA) and ethyl acetate, and 0.5 parts by mass of 2,2'-azobisisobutyronitrile (AIBN) were heated and stirred at 80° C. for 3 hours to prepare a solution containing an SiH group-containing methacrylate ester polymer.

Comparative Synthesis Example 3

83 Parts by mass of methyl methacrylate, 17 parts by mass of γ-methacryloxypropyl trimethoxysilane, 900 parts by mass of ethyl acetate, and 0.5 parts by mass of 2,2'-azobisisobutyronitrile (AIBN) were heated and stirred at 80° C. for 3 hours to prepare a solution containing a methyl methacrylate polymer.

Example 1

1 Part by mass of vinyltrimethoxysilane and 0.1 parts by mass of hydroquinone were added to 100 parts by mass of solution of SiCH=CH₂ group-containing methacrylate ester polymer prepared in Synthesis Example 3 in ethyl acetate, and the mixture was stirred to obtain a primer composition.

An optical semiconductor apparatus was produced using the obtained primer composition. Various physical properties (external appearance, transmissivity, adhesion (adhesion strength), and corrosion) were measured by evaluation methods shown below. The results are shown in Table 1. The physical properties shown in Table 1 are values measured at 23° C.

[External Appearance]

The resulting primer composition was applied an alumina ceramic substrate by a brush, allowed to stand at 23° C. for 30 minutes, and dried. An addition reaction curing silicone composition (available from Shin-Etsu Chemical Co., Ltd., KER-2500A/B) was applied to the primer composition, and then cured at 150° C. for one hour. The external appearance was observed.

[Transmissivity Test]

The resulting primer composition was applied to a glass slide by a brush, and allowed to stand at 23° C. for 30 minutes, and dried. The transmissivity of the applied glass slide at a wavelength of 400 nm was measured by using the air as a blank. After then, the heat resistance of the glass slide to which the primer was applied was deteriorated by 150° C.×500 hours, and 150° C.×1,000 hours. Change of transparency of the primer itself was confirmed.

[Adhesion (Adhesion Strength) Test]

Figure 2:
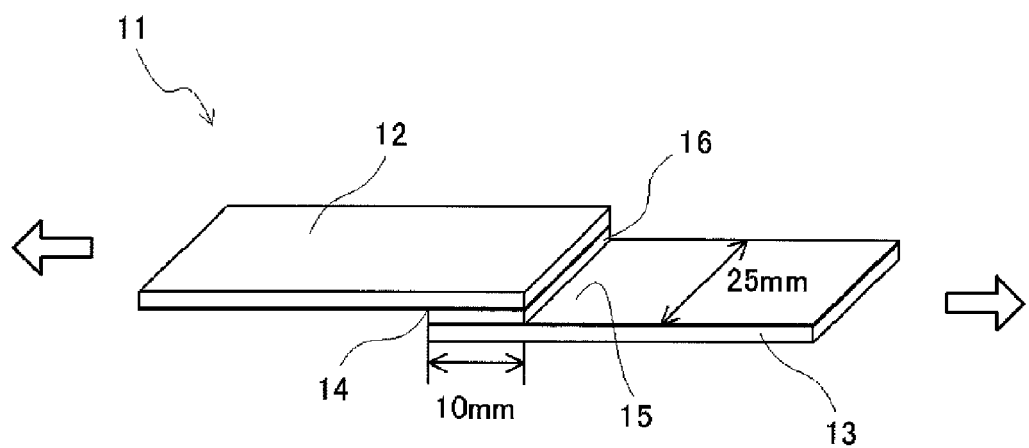
FIG. 2: a perspective view illustrating a test piece for an adhesion test in Examples of the present invention.

A test piece 11 for an adhesion test as shown in FIG. 2 was produced. The resulting primer composition was applied to one side of each of two alumina ceramic substrates 12 and 13 so that the thickness was 0.01 mm, allowed to stand at 23° C. for 60 minutes, and dried. Thus, primer composition coatings 14 and 15 were formed. An addition reaction curing silicone rubber composition (available from Shin-Etsu Chemical Co., Ltd., KER-2500A/B) in a thickness of 1 mm was applied (contact area: 25 mm×10 mm=250 mm²) so that the composition was sandwiched between the alumina ceramic substrates 12 and 13 to which the primer compositions 14 and 15 were attached, and cured at 150° C. for 2 hours to produce a cured material 16 of the addition reaction curing silicone rubber composition. A test piece 11 for the adhesion test was produced. Alumina ceramic available from KDS Co., Ltd., was used.

The alumina ceramic substrate to which the primer composition was attached as the test piece was drawn in arrow directions (showed in FIG. 2) by a tensile tester (manufactured by Shimadzu Corporation, Autograph) at a tensile rate of 50 mm/min. The adhesion strength per unit area to be observed was expressed as MPa, and confirmed.

[Corrosion Test]

The resulting primer composition was applied to a silver-plated plate by a brush, allowed to stand at 23° C. for 30 minutes, and dried. An addition reaction curing silicone rubber composition (available from Shin-Etsu Chemical Co., Ltd., KER-2500A/B) was applied in a thickness of 1 mm, and then cured at 150° C. for one hour. A test piece was produced. The test piece and 0.1 g of sulfur crystal were placed in a 100-cc glass bottle. The glass bottle was sealed, and allowed to stand at 70° C. Every predetermined time (one day later, seven days later, and ten days later), the silicone rubber layer was separated. A degree of corrosion of the silver-plated plate was visually observed and evaluated by the following criteria.

o: No corrosion (discoloration)
Δ: Little corrosion (discoloration)
x: Blacking

Example 2

1 Part by mass of vinyltrimethoxysilane and 0.1 parts by mass of hydroquinone were added to 100 parts by mass of solution of SiCH=CH₂ group-containing methacrylate ester polymer prepared in Synthesis Example 4 in ethyl acetate, and the mixture was stirred to obtain a primer composition. An optical semiconductor apparatus was produced using this composition. Various physical properties were measured in the same manner as in Example 1. The results are shown in Table 1.

Comparative Example 1

A primer was not applied and an addition reaction curing silicone rubber composition (available from Shin-Etsu Chemical Co., Ltd., KER-2500A/B) was directly applied to alumina ceramic. The adhesion and corrosion of an optical semiconductor apparatus thus produced were measured in the same manner as in Example 1. The results are shown in Table 1.

Comparative Example 2

1 Part by mass of vinyltrimethoxysilane and 0.1 parts by mass of hydroquinone were added to 100 parts by mass of solution of SiH group-containing methacrylate ester polymer prepared in Comparative Synthesis Example 2 in ethyl acetate, and the mixture was stirred to obtain a primer composition. An optical semiconductor apparatus was produced using this composition. Various physical properties were measured in the same manner as in Example 1. The results are shown in Table 1.

Comparative Example 3

1 Part by mass of γ-glycidoxypropyltrimethoxysilane and 1 part by mass of tetra-n-butyltitanate were added to 100 parts by mass of solution of methacrylate ester polymer prepared in Comparative Synthesis Example 3 in ethyl acetate, and the mixture was stirred to obtain a primer composition. An optical semiconductor apparatus was produced using this composition. Various physical properties were measured in the same manner as in Example 1. The results are shown in Table 1.

TABLE 1

|  | Example 1 | Example 2 | Comparative Example 1 | Comparative Example 2 | Comparative Example 3 |
| --- | --- | --- | --- | --- | --- |
| External appearance of primer film | Colorless | Colorless | Not applying | Colorless | Pale yellow |
| Transmissivity at early stage (%) | 92 | 92 | — | 92 | 85 |
| Transmissivity after 150° C. × 500 hours (%) | 92 | 92 | — | 92 | Crack |
| Transmissivity after 150° C. × 1,000 hours (%) | 91 | 90 | — | 80 |  |
| Adhesion (Alumina ceramic) | 2.8 MPa | 3.2 MPa | 1.2 MPa | 2.5 MPa | 1.5 MPa |
| Corrosion Test |  |  |  |  |  |
| 1 day later | ○ | ○ | × | ○ | ○ |
| 7 days later | ○ | ○ |  | ○ | ○ |
| 10 days later | ○ | ○ |  | ○ | Δ |

As apparent from the results of Table 1, in Examples 1 and 2 using the primer composition which contains a SiCH=CH$_2$ group-containing methacrylate ester polymer, the alumina ceramic is caused to firmly adhere to the rubber cured material of the addition reaction curing silicone rubber composition. Further, in the heat resistance test of a coating itself applied to a glass slide, discoloration does not occur, the coating itself is not changed, and the heat resistance is excellent. In the corrosion test using an Ag-plated plate instead of alumina ceramic of each Example, discoloration did not occur after one day had elapsed, and an effect of suppressing discoloration (corrosion) appeared after ten days had elapsed.

On the other hand, as apparent from the results of Table 1, in Comparative Example 1 not forming a primer, the adhesion is not sufficient, and the corrosion after one day appears in the corrosion test. In the heat resistance test of Comparative Example 2 using a primer composition that contains a SiH group-containing methacrylate ester polymer instead of the component (A), the heat resistance, the transmissivity after 1,000 hours was decreased, and the heat resistance was low. In the heat resistance test of Comparative Example 3 using a primer composition that contains a methyl methacrylate ester polymer instead of the component (A), crack was generated after 500 hours. Also in the corrosion test, discoloration occurred after ten days.

From the results, according to the primer composition of the present invention, it is clear that the adhesion between a substrate mounting an optical semiconductor device and a cured material of an addition reaction curing silicone composition that encapsulates the optical semiconductor device can be improved, the corrosion of a metal electrode on the substrate can be prevented, and the heat resistance of a primer itself can be improved.

The present invention is not restricted to the embodiments shown above. The embodiments are only illustrated, and all that has substantially the same configuration and effect as those of technical concepts described in claims of the present invention is contained in the technical range of the present invention.

What is claimed is:

1. A primer composition which adheres a substrate mounting an optical semiconductor device and a cured material of an addition reaction curing silicone composition that encapsulates the optical semiconductor device, comprising:
   (A) an acrylic resin containing either one or both of an acrylate ester and a methacrylate ester that contains one or more SiCH=CH$_2$ groups in the molecule,
   (B) a solvent, and
   a metal corrosion inhibitor.

2. The primer composition according to claim 1, wherein an amount of the component (B) to be added is 90% by weight or more relative to the whole component.

3. The primer composition according to claim 1, further comprising (C) a silane coupling agent.

4. The primer composition according to claim 2, further comprising (C) a silane coupling agent.

5. An optical semiconductor apparatus, wherein a substrate mounting an optical semiconductor device is adhered to a cured material of an addition reaction curing silicone composition that encapsulates the optical semiconductor device by the primer composition according to claim 1.

6. An optical semiconductor apparatus, wherein a substrate mounting an optical semiconductor device is adhered to a cured material of an addition reaction curing silicone composition that encapsulates the optical semiconductor device by the primer composition according to claim 2.

7. An optical semiconductor apparatus, wherein a substrate mounting an optical semiconductor device is adhered to a cured material of an addition reaction curing silicone composition that encapsulates the optical semiconductor device by the primer composition according to claim 3.

8. An optical semiconductor apparatus, wherein a substrate mounting an optical semiconductor device is adhered to a cured material of an addition reaction curing silicone composition that encapsulates the optical semiconductor device by the primer composition according to claim 4.

9. The optical semiconductor apparatus according to claim 5, wherein the optical semiconductor device is a light-emitting diode.

10. The optical semiconductor apparatus according to claim 6, wherein the optical semiconductor device is a light-emitting diode.

11. The optical semiconductor apparatus according to claim 7, wherein the optical semiconductor device is a light-emitting diode.

12. The optical semiconductor apparatus according to claim 8, wherein the optical semiconductor device is a light-emitting diode.

13. The optical semiconductor apparatus according to claim 5, wherein a material constituting the substrate is any one of a polyphthalamide resin, fiber-reinforced plastics, and ceramic.

14. The optical semiconductor apparatus according to claim 6, wherein a material constituting the substrate is any one of a polyphthalamide resin, fiber-reinforced plastics, and ceramic.

15. The optical semiconductor apparatus according to claim 7, wherein a material constituting the substrate is any one of a polyphthalamide resin, fiber-reinforced plastics, and ceramic.

16. The optical semiconductor apparatus according to claim 8, wherein a material constituting the substrate is any one of a polyphthalamide resin, fiber-reinforced plastics, and ceramic.

17. The optical semiconductor apparatus according to claim 5, wherein the cured material of the addition reaction curing silicone composition is in a rubber state.

18. The optical semiconductor apparatus according to claim 6, wherein the cured material of the addition reaction curing silicone composition is in a rubber state.

19. The optical semiconductor apparatus according to claim 7, wherein the cured material of the addition reaction curing silicone composition is in a rubber state.

20. The optical semiconductor apparatus according to claim 8, wherein the cured material of the addition reaction curing silicone composition is in a rubber state.

21. The optical semiconductor apparatus according to claim 5, wherein the cured material of the addition reaction curing silicone composition is a transparent cured material.

22. The optical semiconductor apparatus according to claim 6, wherein the cured material of the addition reaction curing silicone composition is a transparent cured material.

23. The optical semiconductor apparatus according to claim 7, wherein the cured material of the addition reaction curing silicone composition is a transparent cured material.

24. The optical semiconductor apparatus according to claim 8, wherein the cured material of the addition reaction curing silicone composition is a transparent cured material.

* * * * *